United States Patent [19]
Watanabe

[11] Patent Number: 5,982,664
[45] Date of Patent: Nov. 9, 1999

[54] SEMICONDUCTOR MEMORY CAPABLE OF WRITING AND READING DATA

[75] Inventor: Kenichi Watanabe, Tokyo, Japan

[73] Assignee: Oki Electric Industry Co., Ltd., Tokyo, Japan

[21] Appl. No.: 09/159,660

[22] Filed: Sep. 24, 1998

[30] Foreign Application Priority Data

Oct. 22, 1997 [JP] Japan ..................................... 9-307997

[51] Int. Cl.⁶ .................................................. G11C 16/04
[52] U.S. Cl. ................................... 365/185.11; 365/185.22
[58] Field of Search .......................... 365/185.11, 185.22, 365/185.29, 185.33, 218, 230.03

[56] References Cited

U.S. PATENT DOCUMENTS

| | | | |
|---|---|---|---|
| 5,297,148 | 3/1994 | Harari et al. ....................... | 365/185.33 |
| 5,353,256 | 10/1994 | Fandrich et al. .................... | 365/185.11 |
| 5,509,018 | 4/1996 | Niijima et al. ....................... | 365/185.22 |
| 5,530,828 | 6/1996 | Kaki et al. ........................... | 365/185.33 |
| 5,650,962 | 7/1997 | Arase ................................... | 365/185.33 |

*Primary Examiner*—Trong Phan
*Attorney, Agent, or Firm*—Jones Volentine, LLP

[57] ABSTRACT

A nonvolatile semiconductor memory serving as a semiconductor memory which is capable of erasing data in a batch comprises four banks constituting a storage circuit, a bank control circuit for instructing access to respective banks (writing, reading, etc.), and a status signal output circuit connected to the bank control circuit. The status signal output circuit outputs status signals for instructing access status of respective banks. The status signals are outputted to an external device through a data bus. With such a construction, the access status of respective banks can be easily grasped, so that the data access to the semiconductor memory can be enhanced with efficiency, thereby realizing high speed data processing.

19 Claims, 7 Drawing Sheets

SEMICONDUCTOR MEMORY CAPABLE OF WRITING AND READING DATA

BACKGROUND OF THE INVENTION

1. Field of the Invention

The invention relates to a semiconductor memory, particularly to a semiconductor memory capable of writing and reading data in units of a predetermined plurality of memory cells.

2. Description of the Related Art

Semiconductor memories include random access memory in which data can be freely read and written, and read only memory which is dedicated for reading previously written data. The read only memory is generally composed of a nonvolatile semiconductor memory. As for the read only memory, there is a memory capable of electrically rewriting data (erasing written data and writing another data). The semiconductor memory includes a memory capable of erasing data in a batch.

As for a memory capable of electrically rewriting data, there is a memory capable of writing and reading data in unit of predetermined plural memory cells (predetermined plural memory cells are defined as banks) relative to a memory cell array composed of plural memory cells incorporated in the memory.

High speed access (reading and writing) has been recently required in a semiconductor memory. To realize a high speed access, a semiconductor memory capable of reading and writing in unit of bank requires access to every bank independently. Particularly, it is required to independently and efficiently access respective banks after confirming access status of respective banks. However, a semiconductor memory satisfying these requirement has not been developed hitherto.

A semiconductor memory has a tendency to include more pins as terminals through which signals are supplied. In a semiconductor memory capable of reading and writing data in unit of bank, it is preferable to avoid the provision of output terminals for signals to instruct access status in order to confirm the access status of respective banks. The reason is that if the number of terminals are increased, a scale of the semiconductor memory is increased, leading to the increase of cost.

It is therefore an object of the invention to provide a semiconductor memory capable of realizing the access to respective banks efficiently and independently upon confirmation of access status of respective banks.

It is another object of the invention to provide a semiconductor memory capable of realizing the access to respective banks efficiently independently without increasing the number of terminal for confirming access status of respective banks.

SUMMARY OF THE INVENTION

To achieve the above objects, the invention is structured such that a semiconductor memory capable of writing and reading data in unit of bank, wherein predetermined memory cells are defined as one bank, comprises a storage circuit composed of plural banks and capable of storing data therein, a control circuit which outputs a control signal for instructing reading and writing data relative to respective banks of the storage circuit, and a status signal output circuit connected to the control circuit for outputting status signals for instructing status of respective banks of the storage circuit.

With such a construction, status of respective banks can be grasped by status signals outputted from the status signal output circuit. It is possible to judge whether it is possible to gain access to respective banks or not in response to the status signals. As a result, it is possible to enhance data access to a semiconductor memory with efficiency, thereby realizing high speed data processing.

Further, according to the invention, data and the status signals may be transmitted through a data bus.

With such a construction, terminals for outputting the status signals may be shared with input/output terminals from or to which data is transmitted through the data bus. As a result, terminals for confirming access status of respective banks are not increased.

Still further, according to the invention, the status signal output circuit may simultaneously output the status signals representing status of predetermined processings in respective banks.

With such a construction, it is possible to simultaneously confirm the status of predetermined processings in plural banks.

Still further, according to the invention, the status signal output circuit may sequentially output the status signals by each of the banks.

With such a construction, it is possible to simultaneously confirm the status of respective processings in respective banks by each of the banks.

Still further, according to the invention, the semiconductor memory may include a selection circuit for instructing to output a status signal of a predetermined bank, wherein the status signal output circuit outputs a status signal of a bank selected by the selection circuit.

With such a construction, it is possible to confirm only the status of the necessary bank, thereby realizing higher speed data processing.

Still further, according to the invention, the status signals may comprise a signal for instructing a write status and another signal for instructing a read status, or may correspond to a signal for instructing the result of verification whether data is normally written or not on respective banks.

With such a construction, it is possible to accurately grasp necessary information of respective banks.

DETAILED DESCRIPTION OF THE PREFERRED EMBODIMENTS

A semiconductor memory according to preferred embodiments of the invention will be now described in detail with reference to the accompanying drawings. In the description set forth hereunder, components which have substantially the same function and construction are denoted by the same reference numerals, thereby omitting the overlapping explanation.

Figure 1:
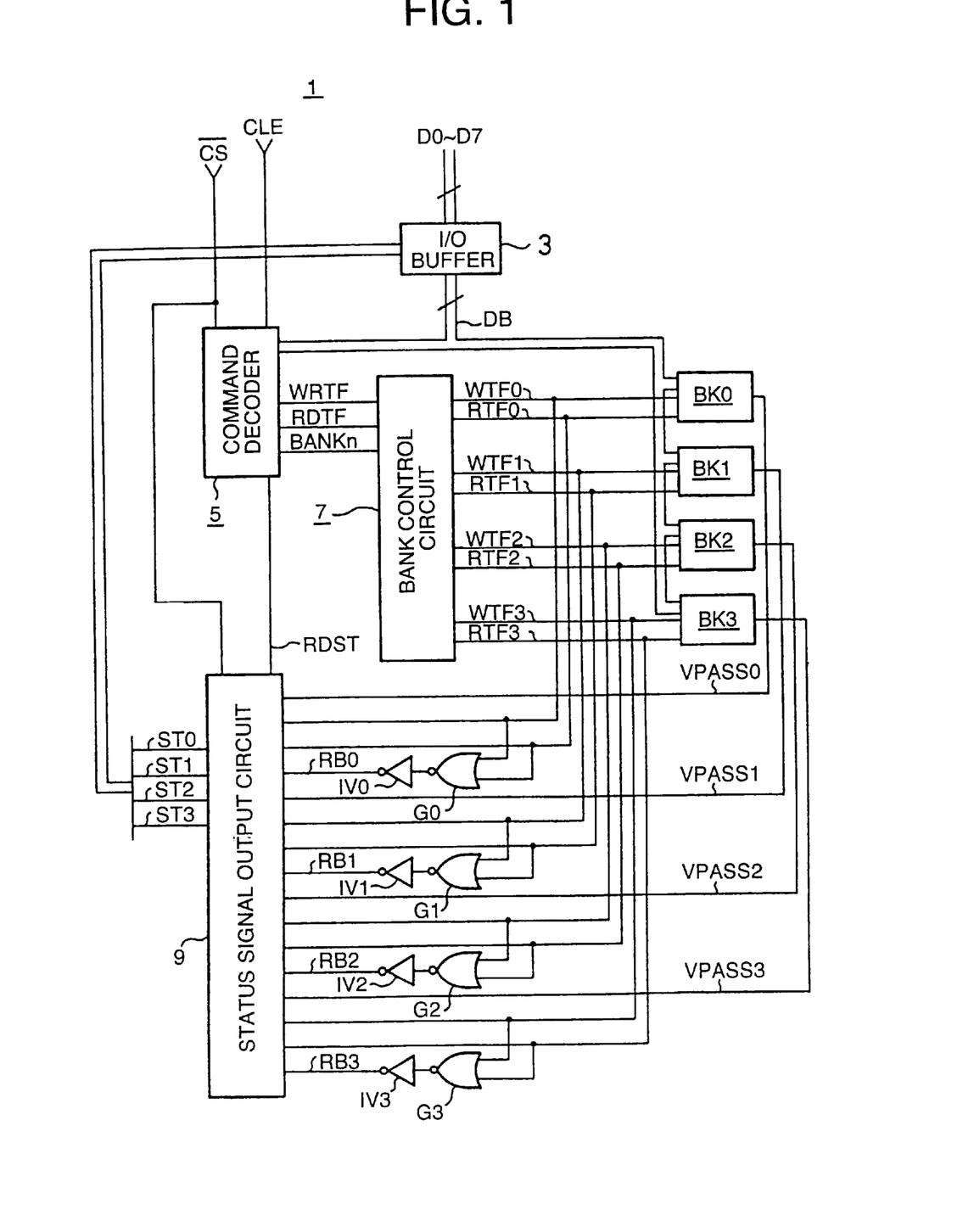
FIG. 1 is a block diagram showing the construction of a semiconductor memory according to a first embodiment of the invention.
Figure 2:
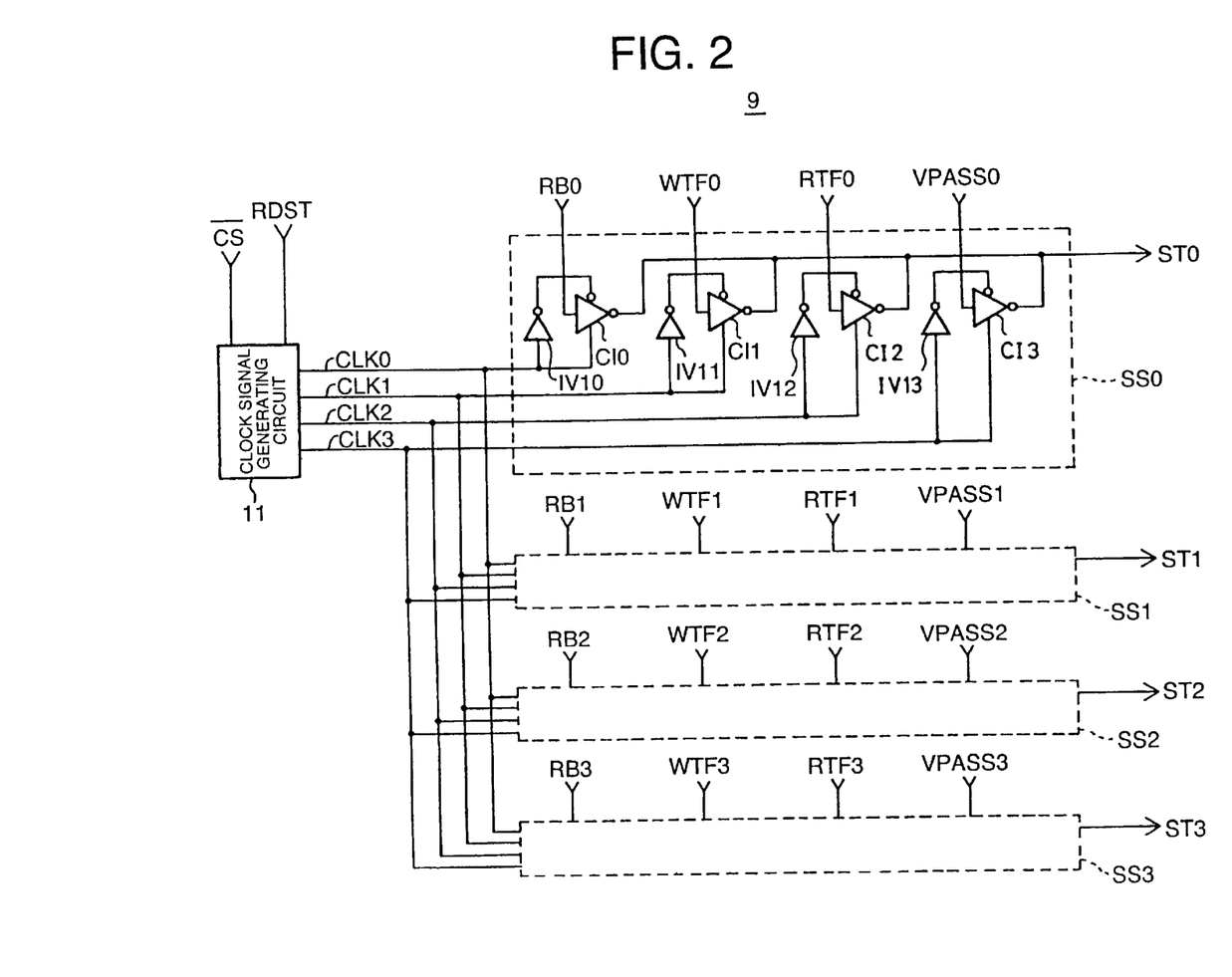
FIG. 2 is a circuit diagram showing the construction of a status signal output circuit provided in the semiconductor memory in FIG. 1.
Figure 3:
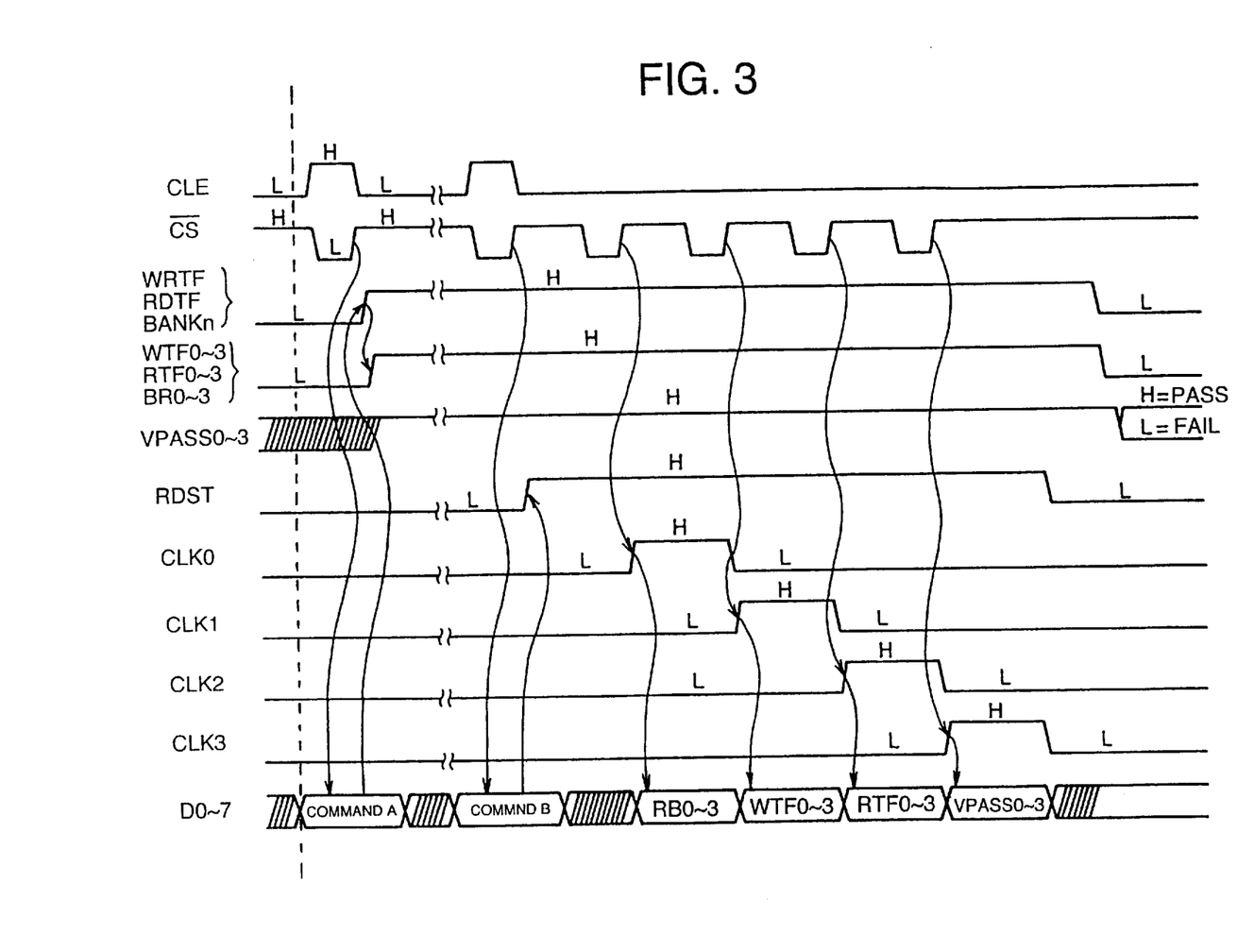
FIG. 3 is a timing chart showing the operation of the semiconductor memory in FIG. 1.

First Embodiment (FIGS. 1 to 3)

The construction of a nonvolatile semiconductor memory capable of electrically rewriting and erasing data in a batch as a semiconductor memory according to a first embodiment is illustrated in FIG. 1.

The nonvolatile semiconductor memory 1 comprises an i/o buffer 3, a command decoder 5, a bank control circuit 7, a status signal output circuit 9, four banks BK0, BK1, BK2 and BK3, four inverters IV0, IV1, IV2 and IV3, and four NOR gates G0, G1, G2 and G3.

The i/o buffer 3 and the command decoder 5 are connected to each other by a 8-bit data bus DB, wherein a given command is supplied to the command decoder 5 from the outside of the nonvolatile semiconductor memory 1 (hereinafter simply referred to as an external device).

The four banks BK0 to BK3 are connected to the i/o buffer 3 by the data bus DB, wherein given data D0 to D7 are written on respective banks BK0 to BK3 from an external device, and given data D0 to D7 which are stored in respective banks BK0 to BK3 can be read out to the external device. The respective data D0 to D7 can be outputted to or inputted from the external device through an i/o terminal connected to the i/o buffer 3.

State signals ST0, ST1, ST2 and ST3 which are respectively outputted from the status signal output circuit 9 are assigned to respective data D0, D1, D2 and D3 by the i/o buffer 3, then they are outputted to the external device.

The command decoder 5 is structured such that a command latch enable signal CLE and a chip select signal $\overline{CS}$ are inputted to the command decoder 5 from the external device as well as a command from the i/o buffer 3. The command decoder 5 can output to the bank control circuit 7 a write command WRTF for instructing writing of given data, a read command RDTF for instructing reading of given data and a bank select command BANKn for selecting a desired bank. The bank select commands BANKn may divide instruction signals into every bank and may be composed of 2-bit data.

The bank control circuit 7 outputs a write signal WTF0 serving as a data write flag for controlling writing data on the bank BK0, and a read signal RTF0 serving as a data read flag for controlling reading data from the bank BK0. Likewise, the bank control circuit 7 is structured in that it outputs write signals WTF1, WTF2, and WTF3 serving as data write flags for controlling writing data on the banks BK1, BK2 and BK3, and read signals RTF1, RTF2 and RTF3 serving as data read flags for controlling reading data from the banks BK1, BK2 and BK3.

It is structured that the write signals WTF0, WTF1, WTF2 and WTF3, and the read signals RTF0, RTF1, RTF2 and RTF3 which are respectively outputted from the bank control circuit 7 are respectively inputted to the respective banks BK0, BK1, BK2 and BK3 and also to the status signal output circuit 9. The write signal WTF0 and the read signal RTF0 are respectively inputted to one input terminal and another input terminal of the NOR gate G0. Likewise, the write signal WTF1 and the read signal RTF1 are respectively inputted to one input terminal and another input terminal of the NOR gate G1. The write signal WTF2 and the read signal RTF2 are respectively inputted to one input terminal and another input terminal of the NOR gate G2. The write signal WTF3 and the read signal RTF3 are respectively inputted to one input terminal and another input terminal of the NOR gate G3.

An output of the NOR gate G0 is inputted to an input terminal of the inverter IV0. Likewise, outputs of the NOR gates G1, G2 and G3 are respectively connected to input terminals of the inverters IV1, IV2 and IV3.

The inverter IV0 outputs a Ready/Busy signal RB0 as a data access flag. Likewise, the inverter IV1 outputs a Ready/Busy signal RB1 as a data access flag. The inverter IV2 outputs a Ready/Busy signal RB2 as a data access flag. The inverter IV3 outputs a Ready/Busy signal RB3 as a data access flag. All the Ready/Busy signals RB0 to RB3 are inputted to the status signal output circuit 9. Respective Ready/Busy signals RB0 become H level (Busy) in voltage level when write or read is instructed to the objective bank, and they become L level (Ready) in voltage level in other cases.

It is structured that verify circuits (not shown) are respectively incorporated in respective banks BK0 to BK3, wherein the verify circuits in respective banks BK0 to BK3 output verify pass signals VPASS0, VPASS1, VPASS2 and VPASS3 serving as verification flags to the status signal output circuit 9 when a verification processing, which is executed after the given data write processing relative to the respective banks BK0 to BK3, is passed. Each verify circuit is a circuit for verifying whether written data is normally written or not. As a result of verification, if data is normally written (passed), the verify pass signals VPASSn (n is any of 0, 1, 2 and 3) become H level in voltage level and they become L level in voltage level in other cases.

The chip select signal $\overline{CS}$ is inputted to the status signal output circuit 9 and a status signal output command RDST from the command decoder 5 is also inputted to the status signal output circuit 9.

The construction of the status signal output circuit 9 is explained with reference to FIG. 2. The status signal output circuit 9 has a clock signal generating circuit 11 and four status flag serial converters SS0, SS1, SS2 and SS3.

The clock signal generating circuit 11 receives the chip select signal $\overline{CS}$ and the status signal output command RDST and sequentially outputs clock signals CLK0, CLK1, CLK2 and CLK3. The circuit is structured that the clock signals CLK0, CLK1, CLK2 and CLK3 are all inputted to the status flag serial converters SS0, SS1, SS2 and SS3.

The Ready/Busy signal RB0, the write signal WTF0, the read signal RTF0 and the verify pass signal VPASS0 are respectively inputted to the status flag serial converter SS0. Likewise, the Ready/Busy signal RB1, the write signal WTF1, the read signal RTF1 and the verify pass signal VPASS1 are respectively inputted to the status flag serial converter SS1. The Ready/Busy signal RB2, the write signal WTF2, the read signal RTF2 and the verify pass signal VPASS2 are respectively inputted to the status flag serial converter SS2. The Ready/Busy signal RB3, the write signal WTF3, the read signal RTF3 and the verify pass signal VPASS3 are respectively inputted to the status flag serial converter SS3.

The constructions of the status flag serial converters SS0 to SS3 are described. Since these status flag serial converters SS0 to SS3 have substantially the same constructions, and hence the construction of the status flag serial converter SS0 is typically explained.

The status flag serial converter SS0 comprises four clocked inverters CI0, CI1 CI2 and CI3, and four inverters IV10, IV11, IV12 and IV13.

The clock signal CLK0 outputted from the clock signal generating circuit 11 is inputted to an N terminal of the clocked inverter CI0, and also inputted to a P terminal of the clocked inverter CI0 through the inverter IV10. Likewise, the clock signal CLK1 outputted from the clock signal generating circuit 11 is inputted to an N terminal of the clocked inverter CI1, and also inputted to a P terminal of the clocked inverter CI1 through the inverter IV11. The clock signal CLK2 is inputted to an N terminal of the clocked inverter CI2, and also inputted to a P terminal of the clocked inverter CI2 through the inverter IV12. The clock signal CLK3 is inputted to an N terminal of the clocked inverter CI3, and also inputted to a P terminal of the clocked inverter CI3 through the inverter IV13. Respective clocked inverters CI0 to CI3 output signals which are produced by inverting voltage levels of signals inputted to the input terminals thereof when L level signals in voltage level are inputted to the P terminals or H level signals in voltage level are inputted to the N terminals thereof. Respective clocked inverters CI0 to CI3 are prohibited to output signals in other cases.

The Ready/Busy signal RB0 is inputted to the input terminal of the clocked inverter CI0. The write signal WTF0 is inputted to the input terminal of the clocked inverter CI1. The read signal RTF0 is inputted to the input terminal of the clocked inverter CI2. The verify pass signal VPASS0 is inputted to the input terminal of the clocked inverter CI3.

The output terminals of the clocked inverters CI0 to CI3 are all shared, and connected to an output line of the status signal ST0.

The status flag serial converter SS1 having substantially the same construction as the status flag serial converter SS0 is connected to an output line of the status signal ST1. Likewise, the status flag serial converter SS2 is connected to an output line of the status signal ST2. The status flag serial converter SS3 is connected to an output line of the status signal ST3.

The operation of the nonvolatile semiconductor memory 1 having the construction as set forth above according to the first embodiment of the invention will be now explained with reference to a timing chart in FIG. 3.

When the command latch enable signal CLE is ON (becomes H level in voltage level), the nonvolatile semiconductor memory 1 is in a command input enable status. A given command A is inputted from an external device through the i/o buffer 3. Then, the command decoder 5 latches the command inputted through the i/o buffer 3 and the data bus DB at the leading edge of the chip select signal $\overline{CS}$. For example, if the command A is a command for the given data write processing relative to the bank BK0, the command decoder 5 outputs the write command WRTF to the bank control circuit 7 (renders voltage level H level), and outputs the bank select commands BANKn for instructing the bank BK0 (renders voltage level H level).

The bank control circuit 7 receives the write command WRTF and the bank select commands BANKn respectively from the command decoder 5, and outputs the write signal WTF0 alone to the bank BK0. That is, voltage level of the write signal WTF0 alone is rendered H level, and other write signals WTF1 to WTF3 and the read signals RTF0 to RTF3 are all rendered L level in voltage level. Further, since voltage level of the write signal WTF0 is H level, voltage level of the Ready/Busy signal RB0 becomes also H level. Meanwhile, the verify pass signals VPASS0 to VPASS3 respectively show the result of verification processing which is executed upon completion of the given data write processing relative to the banks BK0 to BK3. That is, for example, if the given data write processing is executed relative to the bank BK0 and the verification processing which is executed thereafter is passed (PASS), voltage level of the verify pass signal VPASS0 remains H level while if the verification processing is not passed (FAIL), voltage level of the verify pass signal VPASS0 is changed from H level to L level.

Thereafter, the command latch enable signal CLE is again ON so as to output the status of the respective banks BK0 to BK3 to an external device. A command B for outputting the status of respective banks BK0 to BK3 to the external device is inputted to the command decoder 5 from the external device. The command B is latched at the leading edge of the chip select signal $\overline{CS}$, and the command decoder 5 outputs the status signal output command RDST to the status signal output circuit 9 (voltage level is rendered H level).

The clock signal generating circuit 11 of the status signal output circuit 9 sequentially outputs the clock signals CLK0, CLK1, CLK2 and CLK3 upon reception of the chip select signal $\overline{CS}$ and the status signal output command RDST.

The status flag serial converters SS0 to SS3 output the Ready/Busy signals RB0 to RB3 corresponding to respective banks BK0 to BK3 as status signals ST0 to ST3 to the i/o buffer 3 in response to the clock signal CLK0. The i/o buffer 3 assigns the status signals ST0 to ST3 to data D0 to D3 and outputs them to the external device. In the first embodiment, only voltage level of the Ready/Busy signal RB0 of the Ready/Busy signals RB0 to RB3 is rendered H level. Accordingly, value of data D7 to D0 at the timing of the clock signal CLK0 becomes "00000001". Meanwhile, each numeral in the " " is a binary numeral. "0" corresponds to L level in voltage level, and "1" corresponds to H level in voltage level.

Subsequently, the status flag serial converters SS0 to SS3 respectively output the write signals WTF0 to WTF3 corresponding to respective banks BK0 to BK3 as the status signals ST0 to ST3 to the i/o buffer 3 in response to the clock signal CLK1. The i/o buffer 3 assigns the status signals ST0 to ST3 to data D0 to D3 and outputs them to the external device. In the first embodiment, only voltage level of the write signal WTF0 of the write signals WTF0 to WTF3 is rendered H level as set forth above. Accordingly, value of data D7 to D0 becomes "00000001" at the timing of the clock signal CLK1.

Subsequently, the status flag serial converters SS0 to SS3 respectively output the read signals RTF0 to RTF3 corresponding to respective banks BK0 to BK3 as the status signals ST0 to ST3 to the i/o buffer 3 in response to the clock signal CLK2. The i/o buffer 3 assigns the status signals ST0 to ST3 to data D0 to D3 and outputs them to the external device. In the first embodiment, since all voltage levels of the read signals RTF0 to RTF3 are rendered L level as set forth above, value of data D7 to D0 become "00000000" at the timing of the clock signal CLK2.

Finally, the status flag serial converters SS0 to SS3 respectively output the verify pass signals VPASS0 to VPASS3 corresponding to respective banks BK0 to BK3 as the status signals ST0 to ST3 to the i/o buffer 3 in response to the clock signal CLK3. The i/o buffer 3 assigns the status signals ST0 to ST3 to data D0 to D3 and outputs them to the external device. In the first embodiment, there is explained the case where the clock signal CLK3 is inputted to respective status flag serial converters SS0 to SS3 before the verification processing is executed. Accordingly, as shown in FIG. 3, all voltage levels of verify pass signals VPASS0 to VPASS3 are rendered H level. As a result, value of data D7 to D0 becomes "00001111" at the timing of the clock signal CLK3. On the other hand, if the command B is inputted to the command decoder 5 after the verification processing is executed, the result of verification processing can be grasped from data D7 to D0.

According to the nonvolatile semiconductor memory 1 of the first embodiment as mentioned above, the status of four banks BK0 to BK3 can be outputted when the command B is inputted to the command decoder 5. That is, the Ready/Busy signals RB0 to RB3, the write signals WTF0 to WTF3, the read signals RTF0 to RTF3, and the verify pass signals VPASS0 to VPASS3 are sequentially outputted to the external device as data D0 to D3 in synchronization with the clock signals CLK0 to CLK3. Accordingly, it is possible to detect a bank which is in a data access enable status from all the banks BK0 to BK3 without newly providing dedicated output terminals. As a result, data access to the nonvolatile semiconductor memory 1 is highly speeded up.

The order of outputting respect status of the banks BK0 to BK3 can be easily replaced with different orders by partially changing circuit constructions of the status flag serial converters SS0 to SS3.

Figure 4:
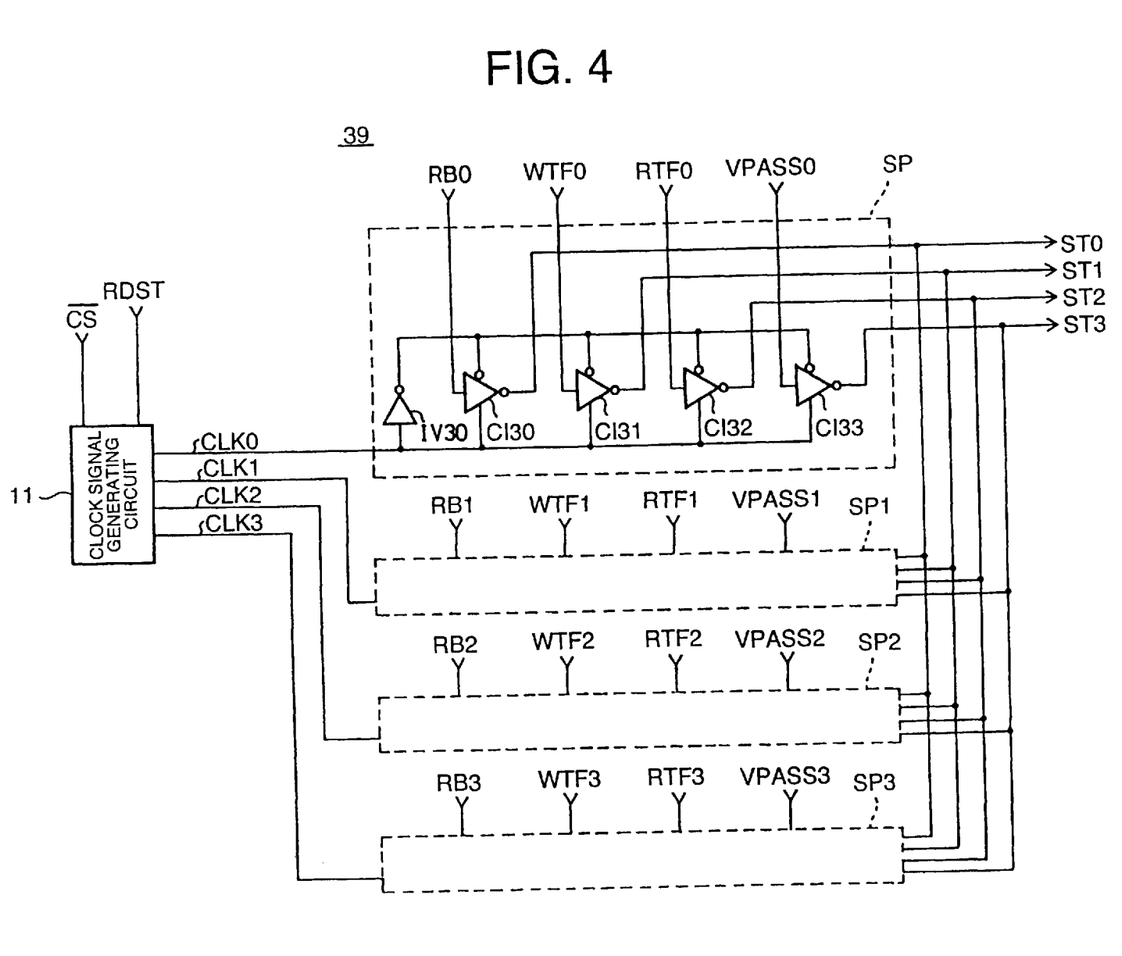
FIG. 4 is a circuit diagram showing the construction of a status signal output circuit provided in a semiconductor memory according to a second embodiment of the invention.
Figure 5:
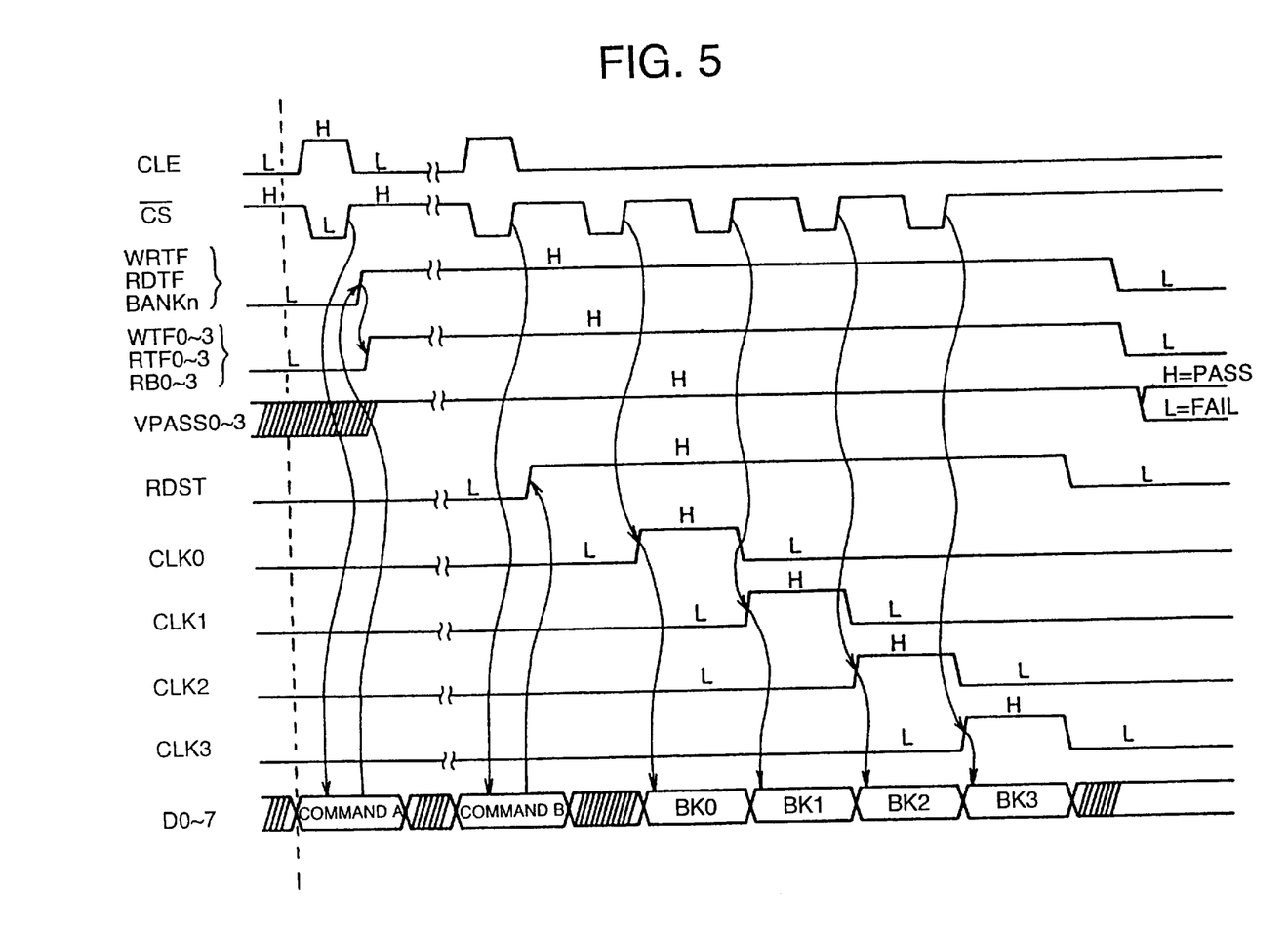
FIG. 5 is a timing chart showing the operation of the semiconductor memory.

Second Embodiment (FIGS. 4 and 5)

A nonvolatile semiconductor memory 31 according to a second embodiment includes a status signal output circuit 39 instead of the status signal output circuit 9 of the nonvolatile semiconductor memory 1 of the first embodiment. Other components of the nonvolatile semiconductor memory 31 are the same as those of the nonvolatile semiconductor memory 1.

The circuit construction of the status signal output circuit 39 used in the nonvolatile semiconductor memory 31 is described with reference to FIG. 4. The status signal output circuit 39 includes a clock signal generating circuit 11 and four status flag parallel converters SP0, SP1, SP2 and SP3.

A clock signal generating circuit 11 is substantially the same as the clock signal generating circuit 11 of the nonvolatile semiconductor memory 1 of the first embodiment, wherein it receives a chip select signal $\overline{CS}$ and a status signal output command RDST and sequentially outputs clock signals CLK0, CLK1, CLK2 and CLK3. The output clock signals CLK0, CLK1, CLK2 and CLK3 are respectively inputted to the status flag parallel converters SP0, SP1, SP2 and SP3.

A Ready/Busy signal RB0, a write signal WTF0, a read signal RTF0 and a verify pass signal VPASS0 are respectively inputted to the status flag parallel converter SP0. Likewise, a Ready/Busy signal RB1, a write signal WTF1, a read signal RTF1 and a verify pass signal VPASS1 are respectively inputted to the status flag parallel converter SP1. A Ready/Busy signal RB2, a write signal WTF2, a read signal RTF2 and a verify pass signal VPASS2 are respectively inputted to the status flag parallel converter SP2. A Ready/Busy signal RB3, a write signal WTF3, a read signal RTF3 and a verify pass signal VPASS3 are respectively inputted to the status flag parallel converter SP3.

The constructions of the status flag parallel converters SP0 to SP3 are described. Since these status flag parallel converters SP0 to SP3 have substantially the same constructions, the construction of the status flag parallel converter SP0 is typically explained.

The status flag parallel converter SP0 comprises four clocked inverters CI30, CI31 CI32 and CI33, and an inverter IV30.

The clock signal CLK0 outputted from the clock signal generating circuit 11 is inputted to N terminals of the clocked inverters CI30, CI31 CI32 and CI33, and also inputted to P terminals of the clocked inverters CI30, CI31 CI32 and CI33 through the inverter IV30.

The Ready/Busy signal RB0 is inputted to the input terminal of the clocked inverter CI30. The write signal WTF0 is inputted to the input terminal of the clocked inverter CI31. The read signal RTF0 is inputted to the input terminal of the clocked inverter CI32. The verify pass signal VPASS0 is inputted to the input terminal of the clocked inverter CI33.

An output terminal of the clocked inverter CI30 of the status flag parallel converter SP0 is shared with output terminals of other clocked inverters (not shown) corresponding to the clocked inverter CI30 of the other status flag parallel converters SP1 to SP3, and connected to an output line of the status signal ST0. Likewise, an output terminal of the clocked inverter CI31 of the status flag parallel converter SP0 is shared with output terminals of other clocked inverters (not shown) corresponding to the clocked inverter CI31 of the other status flag parallel converters SP1 to SP3, and connected to an output line of the status signal ST1. An output terminal of the clocked inverter CI32 of the status flag parallel converter SP0 is shared with output terminals of other clocked inverters (not shown) corresponding to the clocked inverter CI32 of the other status flag parallel converters SP1 to SP3, and connected to an output line of the status signal ST2. An output terminal of the clocked inverter CI33 of the status flag parallel converter SP0 is shared with output terminals of other clocked inverters (not shown) corresponding to the clocked inverter CI33 of the other status flag parallel converters SP1 to SP3, and connected to an output line of the status signal ST3.

The operation of the nonvolatile semiconductor memory 31 having the construction as set forth above according to the second embodiment of the invention will be now explained with reference to a timing chart in FIG. 5.

When the command latch enable signal CLE is ON (becomes H level in voltage level), the nonvolatile semiconductor memory 31 is in a command input enable status. A given command A is inputted from an external device through the i/o buffer 3. Then, the command decoder 5 latches the command A inputted through the i/o buffer 3 and the data bus DB at the leading edge of the chip select signal $\overline{CS}$. For example, if the command A is a command for a given data write processing relative to the bank BK0, the command decoder 5 outputs the write command WRTF to the bank control circuit 7 (renders voltage level H level), and outputs the bank select commands BANKn for instructing the bank BK0 (renders voltage level H level).

The bank control circuit 7 receives the write command WRTF and the bank select commands BANKn respectively from the command decoder 5, and outputs the write signal WTF0 alone to the bank BK0. That is, voltage level of the write signal WTF0 alone is rendered H level, and voltage levels of other write signals WTF1 to WTF3 and voltage levels of the read signals RTF0 to RTF3 are all rendered L level. Since voltage level of the write signal WTF0 is H level, voltage level of the Ready/Busy signal RB0 becomes also H level. Meanwhile, the verify pass signals VPASS0 to VPASS3 respectively show the result of verification processing which is executed upon completion of the given data write processing relative to the banks BK0 to BK3. That is, for example, if the given data write processing is executed relative to the bank BK0 and the verification processing which is executed thereafter is passed (PASS), voltage level of the verify pass signal VPASS0 remains H level while if the verification processing is not passed (FAIL), voltage level of the verify pass signal VPASS0 is changed from H level to L level.

Thereafter, the command latch enable signal CLE is again ON so as to output the status of the respective banks BK0 to BK3 to the external device. A command B for outputting the status of respective banks BK0 to BK3 to the external device is inputted to the command decoder 5 from the external device. The command B is latched at the leading edge of the chip select signal $\overline{CS}$, and the command decoder 5 outputs the status signal output command RDST to the status signal output circuit 39 (voltage level is rendered H level).

The clock signal generating circuit 11 of the status signal output circuit 39 sequentially outputs the clock signals CLK0, CLK1, CLK2 and CLK3 upon reception of the chip select signal $\overline{CS}$ and the status signal output command RDST.

First, the status flag parallel converter SP0 outputs the Ready/Busy signal RB0, the write signal WTF0, the read signal RTF0 and the verify pass signals VPASS0 respectively corresponding to the bank BK0 as the status signals ST0, ST1, ST2 and ST3 to the i/o buffer 3 in response to the clock signal CLK0. The i/o buffer 3 assigns the status signals ST0, ST1, ST2 and ST3 to data D0, D1, D2 and D3 and outputs them to the external device. In the second embodiment, there is explained the case where the command A for writing a given data on the bank BK0 and the command B for outputting the status of respective banks BK0 to BK3 to the external device before the verification processing is executed are respectively inputted Accordingly, voltage level of the Ready/Busy signal RB0, the write signal WTF0 and the verify pass signals VPASS0 to VPASS3 are rendered H level. As a result, value of data D7 to D0 at the timing of the clock signal CLK0 becomes "00001011".

Subsequently, the status flag parallel converter SP1 outputs the Ready/Busy signal RB1, the write signal WTF1, the read signal RTF1 and the verify pass signals VPASS1 respectively corresponding to the bank BK1 as the status signals ST0, ST1, ST2 and ST3 to the i/o buffer 3 in response to the clock signal CLK1. The i/o buffer 3 assigns the status signals ST0, ST1, ST2 and ST3 to data D0, D1, D2 and D3 and outputs them to the external device. In the second embodiment, voltage levels of the signals other than the Ready/Busy signal RB0, the write signal WTF0 and the verify pass signals VPASS0 to VPASS3 are rendered L level as set forth above. Accordingly, value of data D7 to D0 becomes "00001000" at the timing of the clock signal CLK1.

Subsequently, the status flag parallel converter SP2 outputs the Ready/Busy signal RB2, the write signal WTF2 and the verify pass signal VPASS2 respectively corresponding to the bank BK2 as the status signals ST0, ST1, ST2 and ST3 to the i/o buffer 3 in response to the clock signal CLK2. The i/o buffer 3 assigns the status signals ST0, ST1, ST2 and ST3 to data D0, D1, D2 and D3 and outputs them to the external device. In the second embodiment, since voltage levels of the signals other than the Ready/Busy signal RB0, the write signal WTF0 and the verify pass signals VPASS0 to VPASS3 are rendered L level as set forth above. Accordingly, value of data D7 to D0 becomes "00001000" at the tiling of the clock signal CLK2.

Finally, the status flag parallel converter SP3 outputs the Ready/Busy signal RB3, the write signal WTF3 and the verify pass signal VPASS3 respectively corresponding to the bank BK3 as the status signals ST0, ST1, ST2 and ST3 to the i/o buffer 3 in response to the clock signal CLK3. The i/o buffer 3 assigns the status signals ST0, ST1, ST2 and ST3 to data D0, D1, D2 and D3 and outputs them to the external device. In the second embodiment, since voltage levels of the signals other than the Ready/Busy signal RB0, the write signal WTF0 and the verify pass signals VPASS0 to VPASS3 are rendered L level as set forth above. Accordingly, value of data D7 to D0 becomes "00001000" at the timing of the clock signal CLK3.

In the second embodiment, there is explained the case where the clock signals CLK0 to CLK3 are inputted to respective status flag parallel converters SS0 to SS3 before the verification processing is executed. Accordingly, as shown in FIG. 5, voltage levels of verify pass signals VPASS0 to VPASS3 are all rendered H level at the time when the clock signals CLK0 to CLK3 are ON (voltage levels thereof are rendered H level). As a result, value of data D3 to which the verify pass signals VPASS0 to VPASS3 are assigned becomes "1". On the other hand, if the command B is inputted to the command decoder 5 after the verification processing is executed, the result of verification processing relative to the banks BK0 to BK3 can be outputted as value of data D3.

According to the nonvolatile semiconductor memory 31 of the second embodiment as mentioned above, the status of four banks BK0 to BK3 can be outputted when the command B is inputted to the command decoder 5. That is, the Ready/Busy signals RB0 to RB3, the write signals WTF0 to WTF3, the read signals RTF0 to RTF3, and the verify pass signals VPASS0 to VPASS3 respectively corresponding to the respective banks BK0 to BK3 are sequentially outputted to the external device as data D0 to D3 in synchronization with the clock signals CLK0 to CLK3 by each of the banks BK0 to BK3. Accordingly, like the nonvolatile semiconductor memory 1 of embodiment, it is possible to detect a bank which is in a data access enable status from all the banks BK0 to BK3 without newly providing dedicated output terminals. As a result, data access to the nonvolatile semiconductor memory 31 is highly speeded up. As a result, data access to the nonvolatile semiconductor memory 31 is highly speeded up.

The nonvolatile semiconductor memory 31 of the second embodiment can cope with the increase of the number of bank, even if it is increased, by increasing the status flag parallel converters each having a simple circuit construction.

The order of outputting respect status of the banks BK0 to BK3 can be easily replaced with different orders by partially changing circuit constructions of the status flag parallel converters SP0 to SP3.

Figure 6:
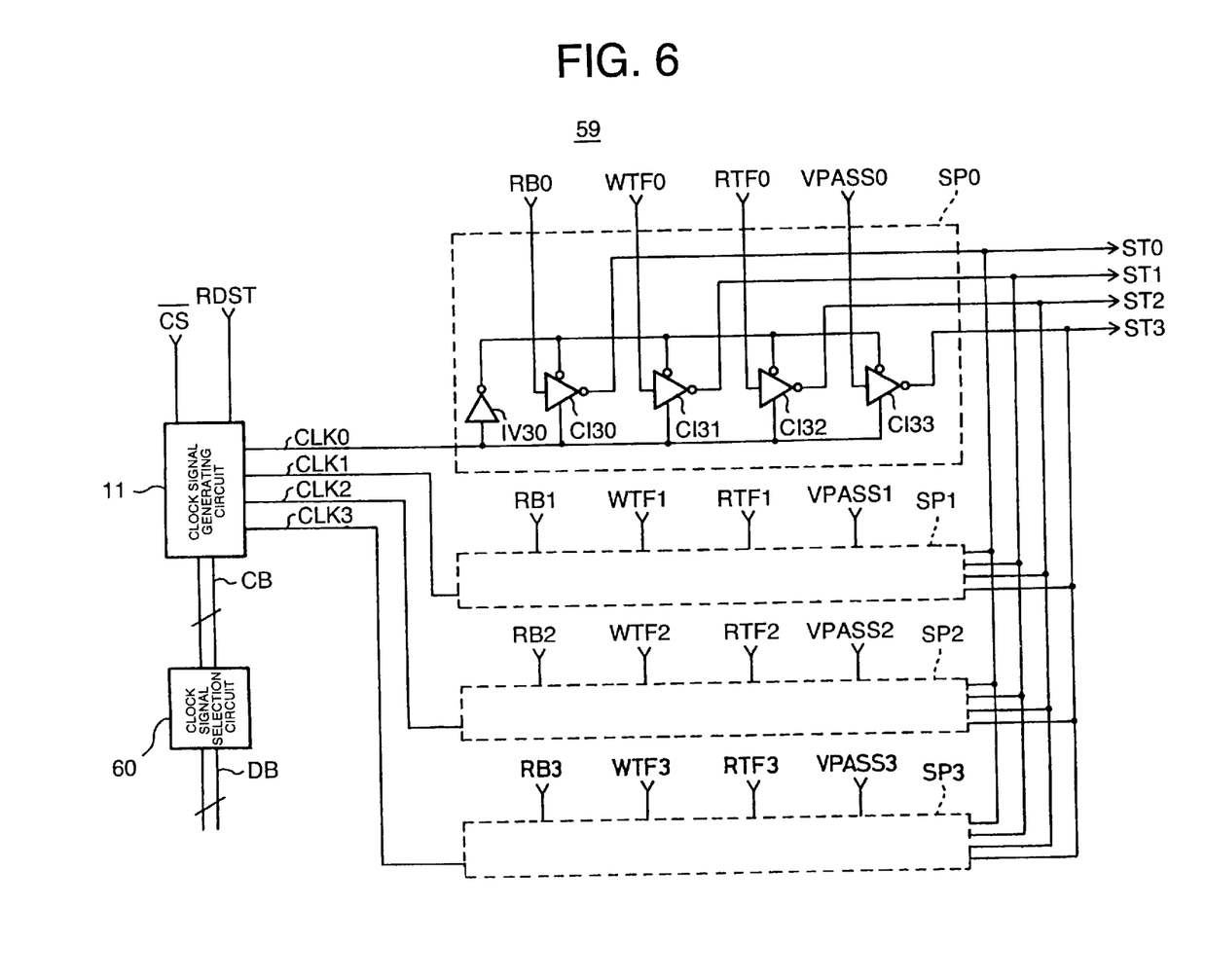
FIG. 6 is a circuit diagram showing the construction of a status signal output circuit provided in a semiconductor memory according to a third embodiment of the invention.
Figure 7:
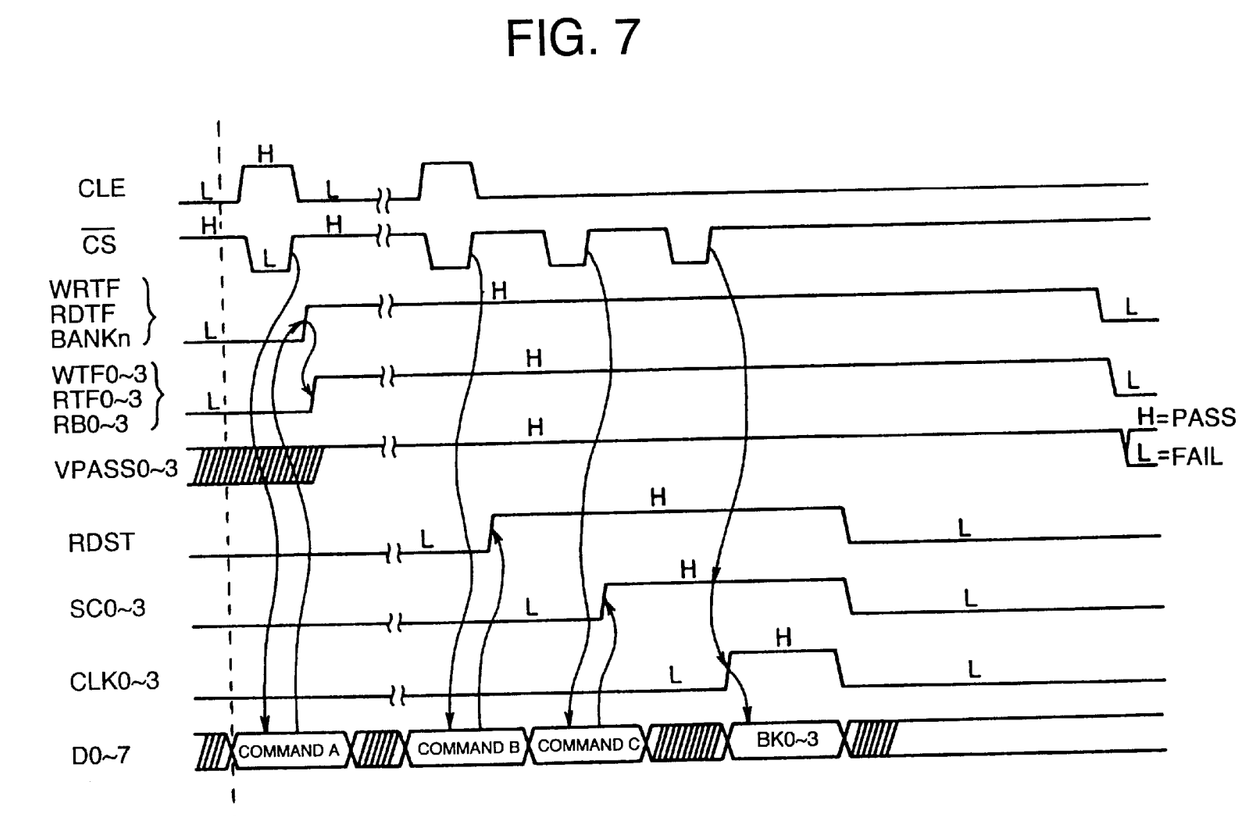
FIG. 7 is a timing chart showing the operation of the semiconductor memory.

Third Embodiment (FIGS. 6 and 7)

A nonvolatile semiconductor memory 51 according to a third embodiment includes a status signal output circuit 59 instead of the status signal output circuit 39 of the nonvolatile semiconductor memory 31 of the second embodiment. Other components of the nonvolatile semiconductor memory 51 are the same as those of the nonvolatile semiconductor memory 31.

The circuit construction of the status signal output circuit 59 used in the nonvolatile semiconductor memory 51 is structured as shown in FIG. 6 such that a clock signal selection circuit 60 serving as a status flag parallel converter selection circuit is added to the status signal output circuit 39 used in the nonvolatile semiconductor memory 31 of the second embodiment. As for other components, the status signal output circuit 59 are substantially the same as the status signal output circuit 39.

The clock signal selection circuit 60 is connected to the i/o buffer 3 by a 8-bit data bust DB. Further, the clock signal selection circuit 60 is connected to the clock signal generating circuit 11 by a 4-bit command bus CB.

The operation of the nonvolatile semiconductor memory 51 having the construction as set forth above according to the third embodiment of the invention will be now explained with reference to a timing chart in FIG. 7.

When a command latch enable signal CLE is ON (becomes H level in voltage level), the nonvolatile semiconductor memory 51 is in a command input enable status. A given command A is inputted from an external device through an i/o buffer 3. Then, a command decoder 5 latches the command A inputted through the i/o buffer 3 and a data bus DB at the leading edge of a chip select signal $\overline{CS}$. For example, if the command A is a command for a given data write processing relative to a bank BK0, the command decoder 5 outputs a write command WRTF to a bank control circuit 7 (renders voltage level H level), and outputs bank select commands BANKn for instructing the bank BK0 (renders voltage level H level).

The bank control circuit 7 receives the write command WRTF and the bank select commands BANKn respectively from the command decoder 5, and outputs a write signal WTF0 alone to the bank BK0. That is, voltage level of the write signal WTF0 alone is rendered H level, and voltage levels of other write signals WTF1 to WTF3 and voltage levels of read signals RTF0 to RTF3 are all rendered L level. Since voltage level of the write signal WTF0 is H level, voltage level of a Ready/Busy signal RB0 becomes also H level. Meanwhile, verify pass signals VPASS0 to VPASS3 respectively show the result of verification processing which is executed upon completion of the given data write processing relative to the banks BK0 to BK3. That is, for example, if the given data write processing is executed relative to the bank BK0 and the verification processing which is executed thereafter is passed (PASS), voltage level of the verify pass signal VPASS0 remains H level while if the verification processing is not passed (FAIL), voltage level of the verify pass signal VPASS0 is changed from H level to L level.

Thereafter, the command latch enable signal CLE is again ON so as to output the status of the respective banks BK0 to BK3 to the external device. A command B for outputting the status of respective banks BK0 to BK3 to the external device is inputted to the command decoder 5 from the external device. The command B is latched at the leading edge of the chip select signal $\overline{CS}$, and the command decoder 5 outputs a status signal output command RDST to the status signal output circuit 59 (voltage level is rendered H level).

A command signal C is inputted to the clock signal selection circuit 60 through the i/o buffer 3 from the external device. The clock signal selection circuit 60 supplies any of clock signal selection commands SC0, SC1, SC2 and SC3 to the clock signal generating circuit 11 through the command bus CB upon reception of the command C. The respective clock signal selection commands SC0, SC1, SC2 and SC3 correspond to clock signals CLK0, CLK1, CLK2 and CLK3. For example, the clock signal selection command SC0 is inputted to the clock signal generating circuit 11, the clock signal generating circuit 11 outputs the clock signal CLK0 alone at the leading edge of the chip select signal $\overline{CS}$. That is, the clock signal generating circuit 11 renders only voltage level of the clock signal CLK0 H level.

First, status flag parallel converter SP0 outputs the Ready/Busy signal RB0, the write signal WTF0, the read signal RTF0 and the verify pass signals VPASS0 respectively corresponding to the bank BK0 as the status signals ST0, ST1, ST2 and ST3 to the i/o buffer 3 in response to the clock signal CLK0. The i/o buffer 3 assigns the status signals ST0, ST1, ST2 and ST3 to data D0, D1, D2 and D3 and outputs them to the external device. In the third embodiment, there is explained the case where the command A for writing a given data on the bank BK0 and the command B for outputting the status of respective banks BK0 to BK3 to the external device before the verification processing is executed are respectively inputted to the nonvolatile semiconductor memory 51. Accordingly, voltage levels of the Ready/Busy signal RB0, the write signal WTF0 and the verify pass signals VPASS0 to VPASS3 are rendered H level. As a result, value of data D7 to D0 at the timing of the clock signal CLK0 become "00001011".

According to the semiconductor memory 51 of the third embodiment, a necessary bank is selected from the four banks BK0 to BK3 upon reception of the command B and also command C so that the status of the necessary bank can be outputted to the external device as data D0 to D3. Accordingly, it is possible to detect a bank which in a data access enable state from all the banks BK0 to BK3 without newly providing dedicated output terminals. As a result, data write processing, etc. are highly speeded up. Further, since the status of the given bank can be selectively grasped even if the number of bank is increased, the time for grasping the status of the banks can be sharply shortened.

The clock signal selection circuit 60 provided in the status signal output circuit 59 of the semiconductor memory 51 according to the third embodiment can be applied to the status signal output circuit 9 of the first embodiment. That is, if any of the clock signals CLK0 to CLK3 is selected using the clock signal selection circuit 60 serving as the status flag parallel converter in the status signal output circuit 9 of the first embodiment, a status flag corresponding to the selected clock signal can be outputted to the external device as data D0 to D7. As a result, it is possible to shorten the time for grasping the status of the banks BK0 to BK3, thereby enhancing the data access to the nonvolatile semiconductor memory 1 with efficiency.

Although the first to third embodiments of the invention have been described with reference to the accompanying drawings, the invention is not limited to these embodiments.

For example, although the nonvolatile semiconductor memories 1, 31 and 51 have respective four banks BK0 to BK3 in the first to third embodiments, the number of bank is not limited to four. Further, although there is explained the case where the signals to be inputted to the status signal output circuits 9, 39 and 59 are the verify pass signals VPASS0 to VPASS3, the write signals WTF0 to WTF3, the read signals RTF0 to RTF3, and the Ready/Busy signals RB0 to RB3, other signals representing the status of respective banks BK0 to BK3 may be inputted to the status signal output circuits 9, 39 and 59.

Still further, although the first to third embodiments have been explained with reference to the nonvolatile semiconductor memory capable of erasing data in a batch, the invention is not limited to this nonvolatile semiconductor memory but is applicable to other nonvolatile semiconductor memories such as an EEPROM, etc. and also to a DRAM.

What is claimed is:

1. A semiconductor memory capable of writing and reading data in units of banks, wherein a predetermined number of memory cells is defined as one bank, said semiconductor memory comprising:

a storage circuit composed of a plurality of banks for storing data therein;

a control circuit, coupled to the storage circuit, which outputs a control signal for controlling reading and writing of data within the banks of the storage circuit; and a status signal output circuit, coupled to the control circuit, which generates and outputs a plurality of status signals respectively indicative of a read/write processing status of the plurality of banks of the storage circuit.

2. The semiconductor memory according to claim 1, wherein the data and the status signals are transmitted through a data bus.

3. The semiconductor memory according to claim 1, wherein the status signal output circuit simultaneously outputs the plurality of status signals in parallel.

4. The semiconductor memory according to claim 1, wherein the status signal output circuit sequentially outputs the plurality of status signals.

5. The semiconductor memory according to claim 1, further comprising a selection circuit for selecting one of the banks and causing the status signal output circuit to output a corresponding status signal for the selected bank.

6. The semiconductor memory according to claim 1, wherein the storage circuit verifies whether data is normally written or not within the respective banks, and wherein the status signals include a signal for indicating the result of the verification.

7. The semiconductor memory according to claim 6, wherein the semiconductor memory is a nonvolatile semiconductor memory capable of electrically rewriting data.

8. The semiconductor memory according to claim 3, wherein the status signals comprise at least a first signal for instructing write status and a second signal for instructing a read status, and wherein signals serving as predetermined status signals and corresponding to the first signal and the second signal relative to respective banks are sequentially outputted.

9. The semiconductor memory according to claim 8, wherein the storage circuit verifies whether data is normally written or not within the respective banks, and wherein the status signals include a signal for indicating the result of the verification.

10. A nonvolatile semiconductor memory capable of writing and reading data in units of banks, wherein a predetermined number of memory cells is defined as one bank, said nonvolatile semiconductor memory comprising:

a storage circuit composed of a plurality of banks for storing data therein;

a control circuit, coupled to the storage circuit, which outputs a control signal for controlling reading and writing of data within the banks of the storage circuit; and a status signal output circuit coupled to the control circuit, which generates and outputs a plurality of status signals leading out of the semiconductor memory and respectively indicating operational processing states of the plurality of the banks of the storage circuit.

11. The semiconductor memory according to claim 10, wherein the data and the status signals are transmitted through a data bus.

12. The semiconductor memory according to claim 10, wherein the status signal output circuit simultaneously outputs the plurality of status signals in parallel.

13. The semiconductor memory according to claim 10, wherein the status signal output circuit sequentially outputs the plurality of status signals.

14. The semiconductor memory according to claim 1, further comprising a selection circuit for selecting one of the banks and causing the status signal output circuit to output a status signal for the selected bank.

15. A nonvolatile semiconductor memory capable of writing and reading data in units of banks, wherein a predetermined number of memory cells is defined as one bank, said nonvolatile semiconductor memory comprising:

a storage circuit composed of a plurality of banks for storing data therein, the storage circuit verifying whether data is normally written within the banks;

a control circuit, coupled to said storage circuit, which outputs a control signal for controlling reading and writing of data within the banks of the storage circuit; and a status signal output circuit, coupled to the control circuit, which generates and outputs a plurality of status signals leading out of the semiconductor memory and respectively indicating a write/read status of the plurality of banks and a result of verification of data in the storage circuit.

16. The semiconductor memory according to claim 15, wherein the data and the status signals are transmitted through a data bus.

17. The semiconductor memory according to claim 15, wherein the status signal output circuit simultaneously outputs the plurality of status signals in parallel.

18. The semiconductor memory according to claim 15, wherein the status signal output circuit sequentially outputs the plurality of status signals.

19. The semiconductor memory according to claim 15, further comprising a selection circuit for selecting one of the banks and causing the status signal output circuit to output a status signal for the selected bank.

* * * * *